United States Patent [19]

Gunckel, II et al.

[11] 4,130,892
[45] Dec. 19, 1978

[54] RADIATION HARD MEMORY CELL AND ARRAY THEREOF

[75] Inventors: Thomas L. Gunckel, II, Santa Ana; Alex Rovell, Yorba Linda, both of Calif.; Robert L. Nielsen, Fairport, N.Y.

[73] Assignee: Rockwell International Corporation, El Segundo, Calif.

[21] Appl. No.: 756,454

[22] Filed: Jan. 3, 1977

[51] Int. Cl.² .................. G11C 11/40; G11C 7/02
[52] U.S. Cl. .......................... 365/154; 307/279; 365/156; 365/190
[58] Field of Search ............ 340/173 R, 173 FF; 307/279, 291, DIG. 3; 365/154, 156, 190

[56] References Cited

U.S. PATENT DOCUMENTS

| | | | |
|---|---|---|---|
| 2,706,811 | 4/1955 | Steele | 340/173 FF |
| 3,636,527 | 1/1972 | Zuk | 340/173 FF |
| 3,731,119 | 5/1973 | Matzen | 307/291 |
| 3,980,899 | 9/1976 | Shimada et al. | 340/173 FF |
| 4,038,567 | 7/1977 | Lewis et al. | 307/DIG. 3 |

FOREIGN PATENT DOCUMENTS 456354  2/1975  U.S.S.R. ............................ 340/173 FF

OTHER PUBLICATIONS

Arzubi, Write/Sense Scheme for Monolithic Memories, IBM Technical Disclosure Bulletin, vol. 18, No. 8, 1/76, pp. 2450–2451.

Primary Examiner—Stuart N. Hecker
Attorney, Agent, or Firm—H. Fredrick Hamann; G. Donald Weber, Jr.; Morland C. Fischer

[57] ABSTRACT

A memory cell configuration that is implemented to be relatively hard to the adverse effects of a nuclear event. The presently disclosed memory cell can be interconnected with other like memory cells to form a high speed radiation hard register file. Information is selectively written into and read out of a memory cell comprising the register file, which memory cell preserves previously stored data without alteration in the event of exposure to high levels of nuclear radiation.

19 Claims, 3 Drawing Figures

RADIATION HARD MEMORY CELL AND ARRAY THEREOF

The invention herein described was made in the course of or under a contract or subcontract thereunder, with the Air Force.

BACKGROUND OF THE INVENTION

1. Field of the Invention

This invention relates to a memory cell configuration that is implemented so as to be relatively hard to the adverse effects of nuclear radiation.

2. Prior Art

Exposure of a conventional semiconductor memory cell to a nuclear radiation event may result in both permanent degradation of component parameters as well as a temporary upsetting of cell operation. Permanent degradation in the characteristics of the semiconductor components which comprise the memory cell is typically caused by neutron and total ionizing radiation dose effects. More particularly, a permanent degradation in component characteristics may result in a shifting (i.e. increase or decrease) in the threshold potentials of complementary semiconductor devices, as well as an increase in cell leakage current and a decrease in gain.

In addition, temporary upsets induced by the rapid anneal effects from a nuclear event may result in momentary shifts in the parameters of the semiconductor components which comprise the memory cell. Such rapid anneal effects are common when a memory cell is exposed to a large total ionizing radiation dose from x-rays and gamma rays. The rapid anneal effects may temporarily cause a transient shift in the threshold potentials of the components which comprise the memory cell. As the rapid anneal effects dissipate with time, the parameters of the components subsequently recover to the level of permanent degradation.

What is more, transient radiation is known to connect an equivalent impedance (i.e. a shunt conductance) across the components which comprise a memory cell during a nuclear radiation event. Such transient upsets act to undesirably alter the performance of the memory cell.

Hence, as a consequence of the nuclear event, the resulting ionizing radiation can cause the destruction of previously stored data in a memory cell or create externally applied unbalances which may undesirably switch the logic state of or inhibit the ability to read a selected memory cell from an array thereof. Moreover, the ionizing radiation from a nuclear event may undesirably scramble the associated interface logic which controls such an array of memory cells so that the selection of one memory cell may adversely interfere with the operation of other memory cells comprising the array.

One example of a prior art memory cell can be found in U.S. Pat. No. 3,990,056 issued Nov. 2, 1976.

SUMMARY OF THE INVENTION

Briefly, and in general terms, a radiation hard CMOS memory cell configuration is disclosed having complementary transistor devices which are fabricated by means of silicon-on-sapphire (SOS) techniques. The presently disclosed memory cell is implemented to minimize sensitivity to externally applied unbalances, such as those which result from a nuclear event and can undesirably cause logic scrambling or alteration of the characteristics of the transistor components which form the memory cell and its associated control electronics.

The present memory cell consists of first and second cross-coupled inverter stages. An R-C network is connected between the inverter stages to increase the charging time constant of the memory cell when information is to be written therein so as to thereby delay the response of the cell a sufficient time until the transient effects of nuclear radiation are suitably dissipated.

The present radiation hard memory cell can be arranged in a register file comprising a plurality of cells. The CMOS devices which comprise the memory cell and the control logic for the register file are particularly sized with respect to one another to reduce the magnitude of disrupting photocurrents therethrough. Such photocurrents may undesirably upset or scramble the stored logical condition of the memory cells of the register file. Also included is an external radiation detector means to apply an inhibit signal to the interface control logic of the register file in order to minimize unbalances applied to any of the memory cells, which unbalances result from interactions between the control logic and neighboring memory cells as a consequence of a nuclear event. Thus, any scrambling of the logical state of the memory cells which comprise the register file is inhibited until the nuclear radiation event has subsided and the components of the memory cells and associated control logic recover to their normal operating characteristics. Hence, as a result of the instant invention, the presently disclosed memory cell is relatively hard to neutron and dose effects. Moreover, total dose degradation is suitably compensated for and the logical content of the memory cell is protected from undesirable alteration throughout an exposure to the radiation of the nuclear event.

DESCRIPTION OF THE PREFERRED EMBODIMENT

Figure 1:
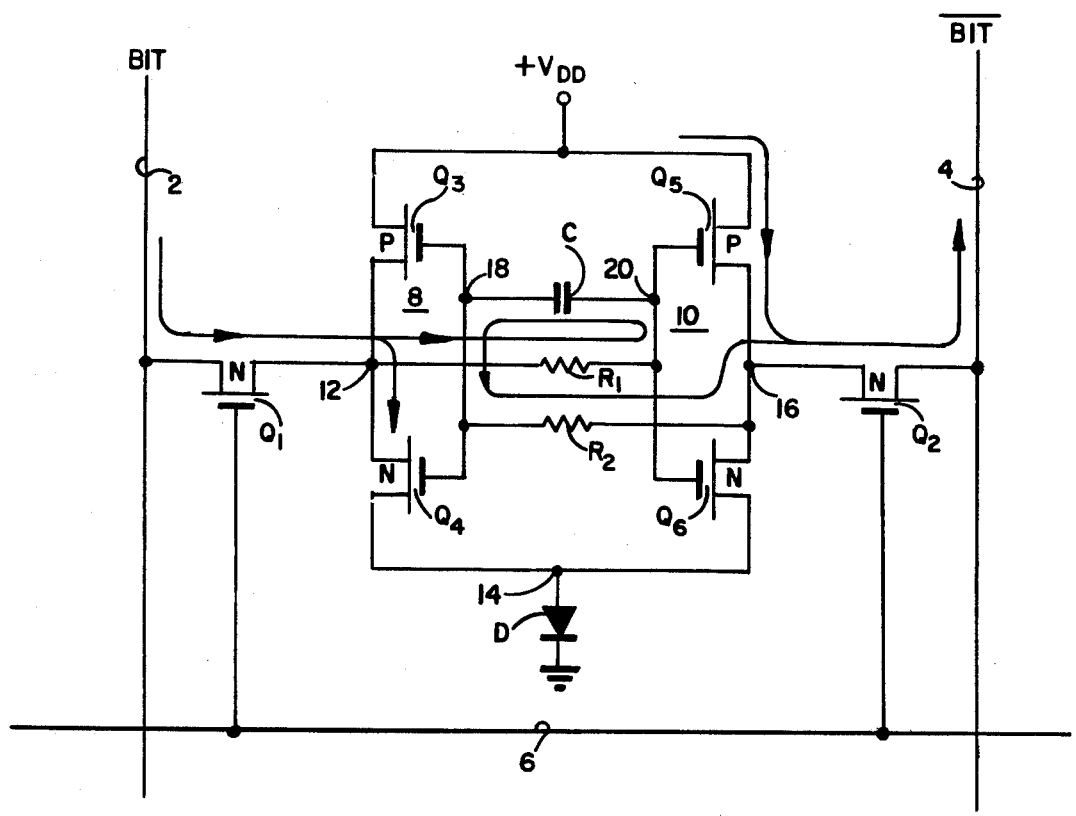
FIG. 1 shows a preferred implementation of the radiation hard memory cell of the present invention.

FIG. 1 shows a preferred circuit for implementing the radiation hardened memory cell of the instant invention. The memory cell is interconnected with a data BIT bus line 2, a data $\overline{\text{BIT}}$ bus line 4 and a row select or address line 6. A logical "0" is written into the memory cell by driving the data BIT bus line 2 to a relatively LOW logic level, and a logical "1" is written into the memory cell by driving the data BIT bus line 2 to a relatively HI logic level. The data $\overline{\text{BIT}}$ bus line 4 is driven to the opposite logic level of the BIT bus line 2.

The present memory cell includes a pair of cross-coupled inverter stages 8 and 10 which form a bistable device, such as a flip-flop. Cross-coupled stages 8 and 10 are connected between BIT line 2 and $\overline{\text{BIT}}$ line 4. Inverter stage 8 includes a pair of series connected, complementary metal oxide semiconductor (CMOS) field effect transistors (FETs) $Q_3$ and $Q_4$. FET $Q_3$ is a p-channel device, while FET $Q_4$ is an n-channel device. One conduction path electrode of FET $Q_3$ is connected to a source of reference potential $V_{DD}$, which typically may be in the range of 9–12 volts d.c. The second conduction path electrode of FET $Q_3$ and a first conduction path electrode of FET $Q_4$ are connected together at a common electrical junction 12. The second conduction path electrode of FET $Q_4$ is connected to a common electrical junction 14 with the anode electrode of a diode D. The cathode electrode of diode D (which will be discussed in greater detail hereinafter in conjunction with FIG. 2) is connected to a source of reference potential, such as ground. The gate or control electrodes of FETs $Q_3$ and $Q_4$ are connected together at a common electrical junction formed by a first data node 18.

Inverter stage 10 also includes a pair of series connected CMOSFETs $Q_5$ and $Q_6$. FET $Q_5$ is a p-channel device, while FET $Q_6$ is an n-channel device. One conduction path electrode of FET $Q_5$ is connected to source $V_{DD}$. The second conduction path electrode of FET $Q_5$ and a first conduction path electrode of FET $Q_6$ are connected together at a common electrical junction 16. The second conduction path electrode of FET $Q_6$ is connected to electrical junction 14. The gate electrodes of FETs $Q_5$ and $Q_6$ are connected together at a common electrical junction formed by a second data node 20.

Respective coupling control field effect transistors $Q_1$ and $Q_2$ are connected between each of the inverter stages 8 and 10 and one of the data BIT or $\overline{BIT}$ bus lines 2 and 4. The gate electrodes of coupling control FETs $Q_1$ and $Q_2$ are connected to the row select line 6.

In a preferred embodiment, FETs $Q_1$–$Q_6$ are fabricated by well-known silicon on sapphire (SOS) techniques (i.e. a layer of silicon is deposited on a sapphire substrate). Because of the physical nature of the CMOS/SOS FETs $Q_3$–$Q_6$, a naturally occurring PN junction exists between the drain diffusions of FETs $Q_3$ and $Q_4$ and FETs $Q_5$ and $Q_6$. More particularly, a respective diode (not shown) is inherently formed at the junction between the relatively $p^+$ doped drain region of FET $Q_3$ or $Q_5$ and the relatively $N^+$ doped drain region of complementary FET $Q_4$ or $Q_6$. Thus, the anode electrode of the diode is the drain region of FET $Q_3$ or $Q_5$, while the cathode electrode of the diode is the drain of FET $Q_4$ or $Q_6$. Silicon on sapphire devices optimize the speed and radiation hardness of the memory cell (i.e. adapt the memory cell to be relatively immune to transient ionizing radiation), inasmuch as only relatively small junction photo currents (i.e. such as those produced by a nuclear event) are generated in the diode region between the source and drain electrodes and through the sapphire substrate of the SOS device.

In accordance with the instant invention, the susceptibility of the instant memory cell to the adverse effects of high levels of nuclear radiation is optimized by increasing the time constant of the cell. A capacitor C is connected between the inputs of the inverter stages 8 and 10 at the common electrical junctions formed by first and second data nodes 18 and 20. The voltage across capacitor C is charged to either polarity depending upon the present state of the memory cell. A first resistor $R_1$ is connected between inverter stage 8, at common electrical junction 12, and inverter stage 10, at data node 20. A second resistor $R_2$ is connected between inverter stage 8, at data node 18, and inverter stage 10, at common electrical junction 16. A pair of resistors $R_1$ and $R_2$ is used to mechanize the present memory cell, so as to provide a balanced (i.e. symmetrical) cell configuration.

Briefly, the operation of the memory cell is described as follows. By way of example, when the memory cell previously stores a logical "0", a relatively LOW logic level signal (ground) is impressed upon data node 20 (and a first plate of capacitor C connected thereto), and a relatively HI logic level signal ($V_{DD}$) is impressed upon data node 18 (and the second plate of capacitor C connected thereto). Therefore, FETs $Q_4$ and $Q_5$ are rendered conductive and FETs $Q_3$ and $Q_6$ are rendered non-conductive. Should it thereafter become desirable to write a binary "1" into the memory cell (i.e. and, thereby, change the state of the memory cell), it is necessary to reverse the polarity of the voltage across capacitor C. Therefore, a relatively HI logic level signal is applied to data BIT bus line 2. Moreover, a relatively LOW logic level signal is applied to data $\overline{BIT}$ bus line 4. The present memory cell is enabled by selectively applying a relatively HI logic level signal to address line 6. Hence, coupling FETs $Q_1$ and $Q_2$ are rendered conductive. Current is supplied from bus line 2 to inverter stage 8 via the conduction path of FET $Q_1$. The arrows indicate the direction of the charging current path through the instant memory cell to reverse the polarity of the voltage across capacitor C and, thereby, switch the logical state of the memory cell. That is, common electrical junction 16 is clamped to ground by means of the $\overline{BIT}$ bus line 4 via the conduction path of FET $Q_2$. Data node 18 and the first plate of capacitor C will ultimately assume a relatively LOW logic level via resistor $R_2$, and data node 20 and the second plate of capacitor C will assume a relatively HI logic level via resistor $R_1$.

Binary information is normally written into the memory cell by the application of a differential voltage across data bus lines 2 and 4, in the manner as previously disclosed. However, the radiation emanating from a nuclear event may also act to apply a similar differential voltage across bus lines 2 and 4, if the memory cell is in close proximity to the nuclear radiation. Exposure to nuclear radiation results in the undesirable application of an impedance (i.e. a shunt conductance) across the source-drain conduction path of each field effect transistor $Q_1$–$Q_6$ comprising the memory cell. This tends to upset the logical state of the memory cell, thereby unnecessarily writing into or changing the logical state of the memory cell.

The addition of capacitor C and resistors $R_1$ and $R_2$ act to slow down the response time of the memory cell. Since the resistances of the resistors $R_1$ and $R_2$ are much larger than the cell input impedance or the impedance of coupling FETs $Q_1$ and $Q_2$, the charging time constant is substantially controlled by resistors $R_1$ and $R_2$ and capacitor C. More particularly, by increasing the time constant, the time needed to effectively write information into the memory cell is increased. That is, the regenerative process which changes the polarity of the voltage across capacitor C in order to switch the logic level of data nodes 18 and 20 slows down. Once the charge on capacitor C has been suitably depleted and begins to reverse, external write voltages can be removed, and the memory cell continues to regenerate into its new logical state. Hence, the inadvertent writing of binary information into the present memory cell due to unbalances caused by transient radiation is delayed a sufficient time until transient effects (e.g. shunt conductances across the conduction path of each transistor caused by a nuclear radiation event) are dissipated. This makes the instant memory cell relatively immune to externally applied unbalances induced by nuclear radiation so that information stored therein is not undesirably altered.

To further immunize the present memory cell from the effects of nuclear radiation, the sizes of FETs $Q_1$-$Q_6$ are selected with particularity. A nuclear radiation event may result in a temporary shifting of the threshold potentials (i.e. rapid anneal effect) of complementary transistors $Q_1$-$Q_6$ immediately after radiation exposure and, thereby, upset the logic state of the cell. That is, the p-channel FETs $Q_3$ and $Q_5$ experience an increase in threshold potential, and the n-channel FETs $Q_4$ and $Q_6$ experience a decrease in threshold potential. To counteract this rapid anneal effect, the p-channel FETs $Q_3$ and $Q_5$, which comprise inverter stages 8 and 10 of the cell, are sized to have a larger channel width than that of the n-channel transistors $Q_4$ and $Q_6$. The relative sizing of the transistors within the memory cell improves the regeneration capability of the cell so that the data nodes 18 and 20 recover to their original states immediately following radiation exposure. What is more, n-channel coupling FETs $Q_1$ and $Q_2$ are sized to have a small channel width (but a relatively larger channel width than those of FETs $Q_3$-$Q_6$) so as to substantially reduce the cell response to external unbalances along bus lines 2 and 4. The shunt resistance resulting from radiation effects is inversely proportional to the channel width of each transistor. Therefore, by selecting FETs $Q_1$ and $Q_2$ with a small channel width (and, thus, a large impedance), spurious current pulses are blocked from inverter stages 8 and 10.

Figure 2:
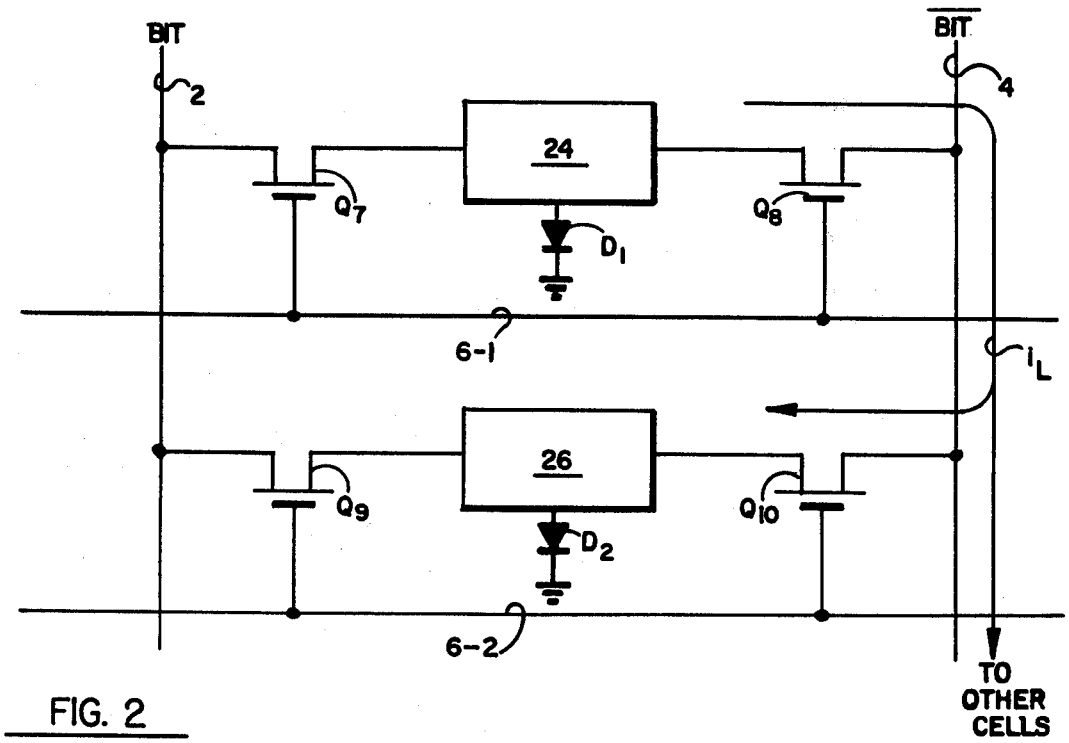
FIG. 2 shows an additional embodiment for implementing the radiation hard memory cell of the present invention.

Referring concurrently to FIGS. 1 and 2, the utilization of diode D to implement the present nuclear radiation hardened memory cell is disclosed in greater detail. A plurality (e.g. 24 and 26) of the present memory cells may be arranged in a convenient array, such as that known as a register file. Therefore, several memory cells comprising the array are connected between data bus lines 2 and 4 via the conduction paths of respective pairs of coupling control transistor FETs $Q_7$, $Q_8$ and $Q_9$, $Q_{10}$ (which transistors correspond to FETs $Q_1$ and $Q_2$ of FIG. 1). A memory cell (e.g. 24) is selectively read by applying a relatively HI logic level signal to the address line (e.g. 6-1) associated therewith. Thus, coupling FETs $Q_7$ and $Q_8$ are rendered conductive. The remaining memory cells (e.g. 26) of the array are inactivated by application of a relatively LOW logic level signal to those address lines (e.g. 6-2) associated therewith. Thus, the respective coupling transistors (e.g. FETs $Q_9$ and $Q_{10}$) are rendered non-conductive. A conventional differential sense amplifier (not shown) may be connected to the data bus lines 2 and 4 so as to read the output logic state of the selected memory cell.

However, as previously disclosed, the rapid anneal effect of a nuclear radiation event may consequently result in a temporary shifting (i.e. decreasing) of the threshold potentials of the n-channel coupling FETs $Q_7$-$Q_{10}$ immediately after radiation exposure. As a result of this shift in threshold potential, the coupling FETs $Q_9$ or $Q_{10}$ of an unselected memory cell 26 may be undesirably rendered partially conductive, depending upon the logical state of the unselected cell 26. Hence, leakage current $i_L$ from a selected memory cell 24 having a relatively HI ($V_{DD}$) stored logic level may be supplied to any unselected memory cell 26 which has a relatively LOW (ground) stored logic level via the conduction path of a partially enabled coupling FET $Q_{10}$. Arrows denote the path of the leakage current $i_L$ associated with the selected memory cell 24.

As a consequence of a nuclear event, sufficient leakage current may be conducted out of the selected memory cell 24 to undesirably switch or inhibit the ability to read the logic state of the cell 24. Therefore, and in accordance with the instant invention, a diode $D_1$, $D_2$ (corresponding to diode D which comprises the memory cell of FIG. 1) is respectively connected between each of the memory cells 24, 26 of the array and a source of reference potential, such as ground. Hence, the output voltage signal of an unselected memory cell 26 having a relatively LOW stored logic level (ground) is increased by a threshold level drop in voltage (e.g. approximately 1 volt) of the respectively connected diode $D_2$. Coupling FET $Q_{10}$ is rendered non-conducting, inasmuch as the increased output voltage of the unselected memory cell 26 (corresponding to that also supplied to the drain electrode of FET $Q_{10}$) exceeds the negative threshold voltage of FET $Q_{10}$ as a result of rapid anneal effects. Hence, FET $Q_{10}$ ceases to be forward biased, because of a lack of sufficient threshold potential between the gate and drain electrodes thereof. By virtue of diode $D_2$, the adverse rapid anneal effects are counteracted, so that the stored logic state of a selected memory cell 24 is preserved to be read shortly after a nuclear event.

Figure 3:
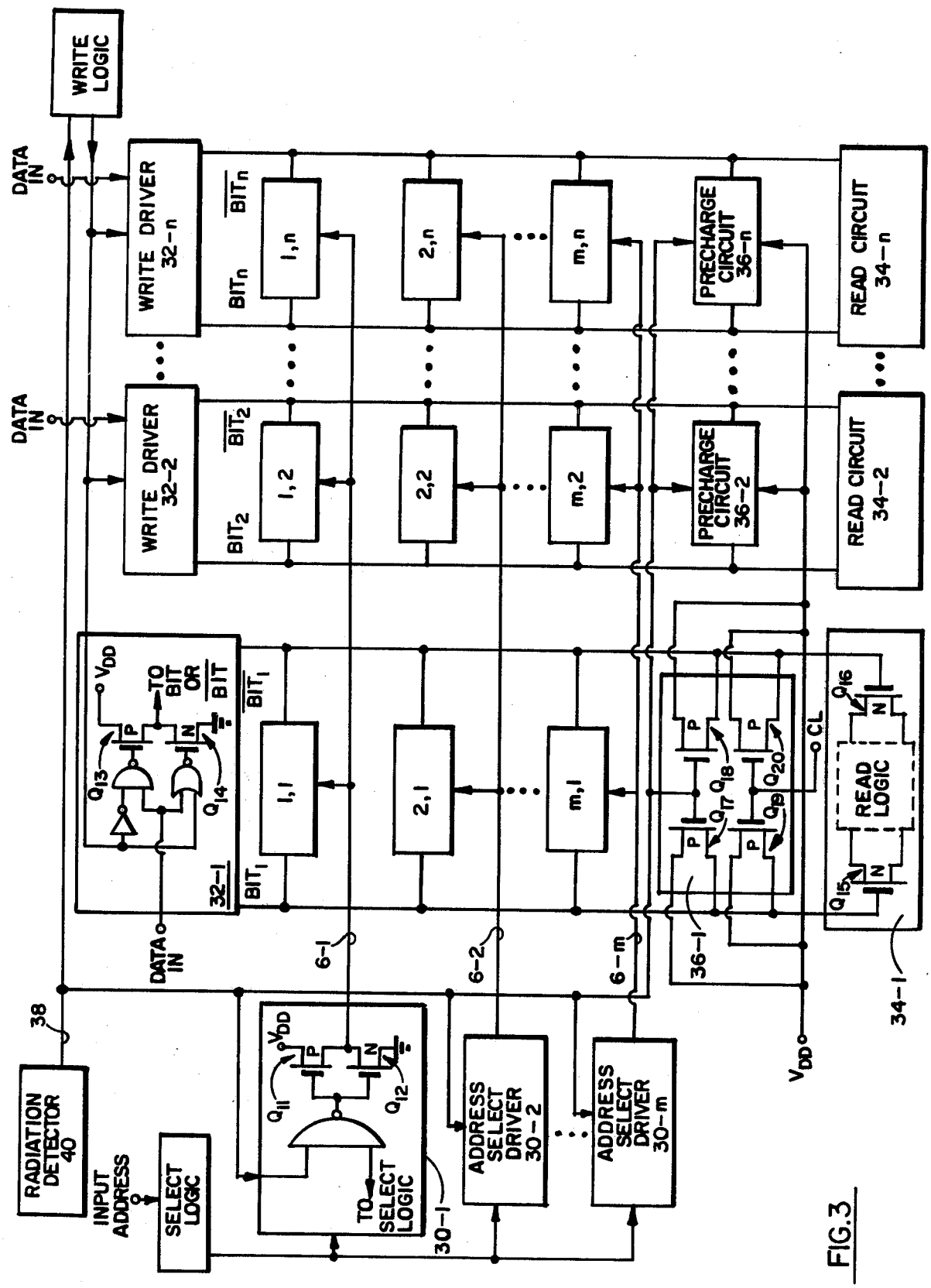
FIG. 3 shows a plurality of the presently disclosed memory cells and the associated interface control logic arranged in a radiation hard register file.

FIG. 3 of the drawings illustrates an array of memory cells of the present invention and the associated interface logic arranged to form an m × n high speed radiation hard register file. Each of the memory cells comprising a row of the register file is connected to a conventional address select driver 30-1 . . . 30-m via a respective address line 6-1 . . . 6-m. Address select driver 30-1 provides an example of a circuit to implement the output stage of this and the remaining address select drivers 30-2 . . . 30-m. The output stage of an address select driver 30-1 . . . 30-m includes the series connection of p-channel and n-channel FETs $Q_{11}$ and $Q_{12}$. FETs $Q_{11}$ and $Q_{12}$ are connected between the $V_{DD}$ and ground sources of reference potential. An output terminal of each of the address select drivers 30-1 . . . 30-m is connected to the respective address line 6-1 . . . 6-m in order to selectively access a row of memory cells from the array for either reading or writing in a well-known fashion.

Each of the memory cells comprising a column of the register file is connected between a respective pair of BIT and $\overline{\text{BIT}}$ data bus lines. Moreover, each column of memory cells is interconnected between a respective conventional write driver 32-1 . . . 32-n, for driving the BIT and $\overline{\text{BIT}}$ data bus lines to their appropriate logic levels, and a respective conventional read circuit 34-1 . . . 34-n, for sensing the logic level of a selected memory cell. Write driver 32-1 provides an example of a circuit to implement the output stage of this and the remaining write drivers 32-2 . . . 32-n. The output stage of the write drivers 32-1 . . . 32-n includes the series connection of p-channel and n-channel FETs $Q_{13}$ and $Q_{14}$ are connected between the $V_{DD}$ and ground sources of reference potential. Each write driver 32-1 . . . 32-n may typically include a pair of similar output stages, whereby the output terminal of each of the pair of write driver output stages is respectively connected to one of the BIT or $\overline{\text{BIT}}$ data bus lines. Since the memory cells comprising each column of the register file share common BIT and $\overline{\text{BIT}}$ data bus lines to interface with the respective write drivers and read circuitry, the write drivers 32-1 . . . 32-n are adapted for tri-state operation.

Read circuit 34-1 provides an example of a circuit to implement this and the remaining read circuits 34-2 . . . 34-n. The associated BIT and $\overline{\text{BIT}}$ data bus lines are respectively connected to the gate electrode of high impedance n-channel transistor FETs $Q_{15}$ and $Q_{16}$. Each of the FETs $Q_{15}$ and $Q_{16}$ interfaces with well-known read logic in a conventional fashion.

A particular memory cell from the register file may become unbalanced by activation of its associated write driver 32-1 . . . 32-n or by interference from other memory cells connected between the same pair of data bus lines. (The read circuits 34-1 . . . 34-n are implemented by having the gate electrodes of high impedance devices $Q_{15}$ and $Q_{16}$ connected to each of the pair of data bus lines, so as to minimize any contribution by the read circuits to cell unbalance). Therefore, a unique precharge circuit 36-1 . . . 36-n is respectively connected to each of the memory cell columns between pairs of BIT and $\overline{BIT}$ data bus lines. Precharge circuit 36-1 provides an example of a circuit to implement this and the remaining precharge circuit 36-2 . . . 36-n. Each precharge circuit 36-1 . . . 36-n includes two pairs of p-channel FETs Qhd 17, $Q_{18}$ and $Q_{19}$, $Q_{20}$. The conduction path of a first FET $Q_{17}$ and $Q_{19}$ from each pair thereof has a conduction path connected between a source of reference potential, $V_{DD}$, and the BIT data bus line. The second FET $Q_{18}$ and $Q_{20}$ from each pair thereof has a conduction path connected between the source of reference potential $V_{DD}$ and the corresponding opposite state $\overline{BIT}$ data bus line. The gate electrodes of the first of the pair of FETs $Q_{17}$ and $Q_{18}$ are connected together and to an inhibit line 38. As will be explained in greater detail hereinafter, the first pair of FETs $Q_{17}$ and $Q_{18}$ of precharge circuits 36-1 . . . 36-n prevent the memory cells comprising the register file from undesirably interacting with each other and with write drivers 32-1 . . . 32-n as a consequence of a nuclear event. The gate electrodes of the second pair of FETs $Q_{19}$ and $Q_{20}$ of precharge circuits 36-1 . . . 36-n are connected together and to a source of clock signals CL. This second pair of FETs $Q_{19}$ and $Q_{20}$ is normally utilized for efficiently reading a selected memory cell from the register file. Although each column of memory cells includes only a single illustrated precharge circuit 36-1 . . . 36-n, it is to be understood that an additional precharge circuit may be conveniently interconnected therewith so as to minimize the time delay to access a particular memory cell.

The register file is also provided with an external inhibit means having a unique application. The inhibit means includes suitable radiation detection circuitry 40 which senses the occurrence of a nuclear event. The radiation detection circuitry 40 is connected via inhibit line 38 to each of the address select drivers 30-1 . . . 30-m, the precharge circuits 36-1 . . . 36-n, and to the write logic of the register file. The write logic is connected to each write driver 32-1 . . . 32-n.

In operation, a selected memory cell is read by differentially transmitting output data from the selected cell to an associated pair of BIT and $\overline{BIT}$ data bus lines. Preceding the start of the read cycle for the selected memory cell, a suitable clock signal CL is applied to the gate electrodes of each of the second pair of FETs $Q_{19}$ and $Q_{20}$ comprising the corresponding precharge circuit 36-1 . . . 36-n. Hence, FETs $Q_{19}$ and $Q_{20}$ are rendered conducting so as to thereby connect each of the associated BIT and $\overline{BIT}$ data bus lines to the source of reference potential $V_{DD}$. This aforementioned connection minimizes the read-disturb signal applied to a selected memory cell during the subsequent read cycle by converting a possible externally applied differential voltage unbalance to a common mode voltage level on both of the BIT and $\overline{BIT}$ data bus lines. Moreover, the read access time of the selected memory cell is reduced, inasmuch as the charge of the selected cell is required to drive only one of the pair of data bus lines to ground (from $V_{DD}$) when the cell is used.

In the event that high levels of nuclear radiation occur, external unbalances are substantially prevented by clamping each of the pair of BIT and $\overline{BIT}$ data bus lines to the source of reference potential $V_{DD}$ until the adverse effects of nuclear radiation have sufficiently subsided. As a result of the nuclear radiation event, a shunt conductance is induced across the FETs $Q_{17}$-$Q_{20}$ which comprise each precharge circuit 36-1 . . . 36-n. Therefore, each FET $Q_{17}$-$Q_{20}$ is rendered conductive. An inhibit signal, supplied to the gate electrodes of each of the first pair of precharge FETs $Q_{17}$ and $Q_{18}$ by means of the radiation detector 40 and inhibit line 28, maintains the conductivity of FETs $Q_{17}$ and $Q_{18}$ and the resulting clamping of both of the BIT and $\overline{BIT}$ data bus lines to the source of reference potential $V_{DD}$ throughout the occurrence of high levels of nuclear radiation.

Supplying each of the pair of BIT and $\overline{BIT}$ lines with a common mode voltage (e.g. $V_{DD}$) increases the time required to deplete the charge on the capacitor C (best shown in FIG. 1) which comprises the present radiation hard memory cell. That is, a longer time is required to discharge capacitor C (in order to switch the corresponding logical state of the memory cell) when a common mode voltage (rather than a differential voltage of opposite polarity) is applied to the BIT and $\overline{BIT}$ data bus lines. Therefore, the response of the memory cell is slowed to make the cell substantially insensitive to the effects of external unbalances. The R-C time constant of the presently disclosed radiation hard memory cell is chosen to be long enough of first permit the effective generation and application of the inhibit signal before the charge of capacitor C can be depleted.

Undesirable interactions with a selected memory cell in the event of a nuclear occurrence are further reduced by switching all of the write drivers 32-1 . . . 32-n to an open-circuited condition (i.e. the third state of their tri-state operating characteristic). That is, the write logic of the register file applies a suitable signal to each write driver 32-1 . . . 32-n to subsequently disable both of the series connected write driver output stage FETs $Q_{13}$ and $Q_{14}$, so that the write driver output terminal is floating with respect to ground. Moreover, the inhibit signal generated by radiation detector 40 is applied to all of the address select drivers 30-1 . . . 30-m via inhibit line 38. The inhibit signal ultimately causes the address select driver output stage FET $Q_{11}$ to be rendered nonconducting while output stage FET $Q_{12}$ is rendered conducting. Hence, the output terminals of each of the address select drivers 30-1 . . . 30-m and the respective address lines 6-1 . . . 6-m are clamped to ground via the conduction path of FET $Q_{12}$, thereby disabling each of the coupling control transistors (e.g. FETs $Q_1$ and $Q_2$ of FIG. 1) connected thereto.

Since the photoconductance of each transistor device (e.g. FETs $Q_{11}$-$Q_{20}$) comprising the circuitry for implementing the output stages for the interface control logic of the radiation hard register file is proportional to its size (i.e. width), the transistor sizes are chosen so as to provide the best possible biasing conditions during the period of initial radiation exposure, before the inhibit signal can be effectively applied. Moreover, each of the FETs $Q_{11}$-$Q_{20}$ includes a layer of silicon deposited upon a sapphire substrate (SOS). More particularly, between the FETs $Q_{11}$ and $Q_{12}$ comprising the output stage of the address select drivers 30-1 ... 30-m, n-channel FET $Q_{12}$ is chosen with a larger channel width than the corresponding channel width of p-channel FET $Q_{11}$. The p-channel FETs $Q_{17}$–$Q_{20}$ which comprise precharge circuits 36-1 ... 36-n are selected with relatively large channel widths. The FETs $Q_{13}$ and $Q_{14}$ which comprise the output stage of the write drivers 32-1 ... 32-n are selected to have the smallest relative channel widths. However, p-channel FET $Q_{13}$ is chosen with a larger channel width than the corresponding channel width of n-channel FET $Q_{14}$. By way of example only, the ratio of the channel widths between FETs $Q_{11}$ and $Q_{12}$ is 0.7:1 and between FETs $Q_{13}$ and $Q_{17}$ is 1.7:1. Moreover, by way of comparison, the channel width of p-channel FETs $Q_{17}$–$Q_{20}$ is selected to be approximately twice the corresponding channel width of n-channel FET $Q_{14}$.

The photoconductance of the transistor devices which comprise the address select drivers 30-1 ... 30-m, the write drivers 32-1 ... 32-n, and the precharge circuits 36-1 ... 36-n act to provide common mode voltages to the BIT and $\overline{\text{BIT}}$ data bus lines, clamp the address lines to ground and connect a relatively high coupling impedance between the memory cells and the data bus lines so as to enable the present memory cell to be capable of absorbing a momentary unbalance while retaining its logic state throughout a nuclear event. By properly choosing the transistor sizes and the R-C time constant of the memory cell, and by applying the inhibit signal to the interface control logic of the register file, the content of the memory cells is protected throughout high levels of nuclear radiation exposure. Moreover, this protection will remain until the radiation detector senses a return to a safe level of radiation, whereby the inhibit signal is terminated. Therefore, any logic scrambles which are applied to the register file as a result of nuclear radiation exposure are avoided, so that the memory cell and the components thereof can recover to their normal operating characteristics.

It will be apparent that while a preferred embodiment of the radiation hard memory cell and register file have been shown and described, various modifications and changes may be made without departing from the true spirit and scope of the invention.

Having thus set forth a preferred embodiment of the invention, what is claimed is:

1. A radiation resistant memory cell comprising:
   first and second cross-coupled inverter stages each of said inverter stages comprising a pair of transistor devices having respective conduction path electrodes and control electrodes,
   the conduction path electrodes of each of said first inverter stage pair of transistor devices connected in electrical series with one another and the control electrodes of each of said first inverter stage pair of transistor devices connected together,
   the conduction path electrodes of each of said second inverter stage pair of transistor devices connected in electrical series with one another and the control electrodes of each of said second inverter stage pair of transistor devices connected together, and
   resistance means and capacitance means interconnected with one another to form a series connected charging current path from said first cross-coupled inverter stage to said second cross-coupled inverter stage to charge said capacitance means and to provide an indication of the logical state of said memory cell, said resistance means and said capacitance means controlling the charging time constant of said memory cell to thereby decrease the response of the memory cell to a radiation event.

2. The radiation resistant memory cell recited in claim 1, wherein said resistance means includes first and second resistors, said first resistor connected between a point between the series connected conduction paths of said first inverter stage pair of transistor devices and the control electrodes of each of said second inverter stage pair of transistor devices and said second resistor connected between a point between the series connected conduction paths of said second inverter stage pair of transistor devices and the control electrodes of each of said first inverter stage pair of transistor devices.

3. The radiation resistant memory cell recited in claim 1 including diode means connected between each of said first and second inverter stages and a source of reference potential.

4. The radiation resistant memory cell recited in claim 1, wherein said cross-coupled inverter stages are connected between a pair of data bus lines, and
   radiation detection means to clamp each of said data bus lines to a common source of reference potential in response to a radiation event.

5. The radiation resistant memory cell recited in claim 1, wherein said capacitance means is connected between the control electrodes of said first inverter stage pair of transistor devices and the control electrodes of said second inverter stage pair of transistor devices.

6. The radiation resistant memory cell recited in claim 1, wherein each of said first and second inverter stage pairs of transistor devices includes first and second field effect transistors which are of an opposite conductivity type with respect to one another.

7. The radiation resistant memory cell recited in claim 6, wherein said first field effect transistors of each of said first and second inverter stages are p-channel metal oxide semiconductor field effect transistors and said second field effect transistors of each of said first and second inverter stages are n-channel metal oxide semiconductor field effect transistors,
   said p-channel field effect transistors having wider channel widths than the corresponding channel width of said n-channel field effect transistors.

8. The radiation resistant memory cell recited in claim 6, wherein each of said first and second inverter stage pairs of transistor devices is fabricated from a layer of silicon deposited on a sapphire substrate.

9. A memory array substantially insensitive to the effects of radiation including:
   source means for supplying a plurality of reference potentials,
   a plurality of memory cells, each of said memory cells selectively connected between a pair of data bus lines,
   write circuit means connected to drive said data bus lines,
   memory cell address selection means having an address line connected to said plurality of memory cells for accessing certain ones thereof, said address selection means selectively enabled to clamp the address line to said source means to receive a first of said plurality of reference potentials,
   precharge circuit means selectively enabled to connect each of said data bus lines to said source means to receive a second of said plurality of reference potentials, and control signal generating means connected to each of said write circuit means, said address selection means, and said precharge circuit means to control the operation thereof, said control signal generating means responsive to a radiation event to supply corresponding control signals to thereby disable said write circuit means and to enable each of said address selection means and said precharge circuit means.

10. The radiation insensitive memory array recited in claim 9, wherein said control signal generating means comprises a radiation detector.

11. The radiation insensitive memory array recited in claim 9, wherein each of said write circuit means and said memory cell address selection means includes a pair of interconnected complementary p and n-channel field effect transistor devices arranged to form a respective output stage, the n-channel field effect transistor device comprising said address selection means output stage having a channel width which is relatively wider than that of its complementary p-channel field effect transistor device, and the p-channel field effect transistor device comprising said write circuit means output stage having a channel width which is relatively wider than that of its complementary n-channel field effect transistor device.

12. The radiation insensitive memory array recited in claim 11, wherein said precharge circuit means includes at least a pair of p-channel field effect transistor devices, each device having a conduction path respectively connected between one of said data bus lines and said source means, and said precharge circuit means field effect transistor devices having channel widths which are relatively wider than those of the transistor devices comprising said write circuit means output stage.

13. The radiation insensitive memory array recited in claim 12, wherein each of the pairs of interconnected complementary field effect transistors comprising the respective output stages of said write circuit means and said address selection means and the transistor devices comprising said precharge circuit means is fabricated from a layer of silicon disposed on a sapphire substrate.

14. The radiation insensitive memory array recited in claim 9, wherein each of said plurality of memory cells includes first and second cross-coupled inverter stages, and resistance and capacitance means interconnected between an electrical junction of said first inverter stage and an electrical junction of said second inverter stage of at least some of said memory cells for controlling the charging time constant of said memory cells to thereby diminish the response of said memory cells to a radiation event.

15. The radiation insensitive memory array recited in claim 14, including unidirectional current conducting means having a conduction path connected between each of said cross-coupled inverter stages and said source means for receiving the first of said plurality of reference potentials.

16. The radiation insensitive memory array recited in claim 15, wherein said unidirectional current conducting means is a diode.

17. In combination:

source means for supplying a plurality of reference potentials, memory cell means including first and second cross-coupled inverter stages, capacitance means connected between an electrical junction of said first cross-coupled inverter stage and an electrical junction of said second cross-coupled inverter stage, the polarity of a signal applied to said capacitance means being indicative of the logical state of said memory cell means, data bus line means to be connected to each of said cross-coupled inverter stages for receiving an indication of the logical state of said memory cell means, coupling transistor devices having respective conduction paths selectively connected between each of said inverter stages and said data bus line means and control electrodes connected to a means for selectively addressing said memory cell means, clamping means connected between said coupling transistor devices and said source means, and radiation detection means connected to said clamping means and responsive to a radiation event to activate said clamping means and thereby clamp said coupling transistor devices to said source means.

18. The combination recited in claim 17, wherein said clamping means is comprised of first and second clamping devices, said first clamping device connected to said means for selectively addressing said memory cell means for clamping the control electrodes of said coupling transistor devices to said source means and to a first of said plurality of reference potentials to thereby disable said coupling transistor devices during the occurrence of a radiation event, and said second clamping device connected to said data bus line means for clamping said data bus line means to said source means and to a second of said plurality of reference potentials during the occurrence of a radiation event.

19. The combination recited in claim 17, further including resistance means interconnected with said capacitance means between the electrical junction of said first cross-coupled inverter stage and the electrical junction of said second cross-coupled inverter stage to form a current path between said first and second inverter stages for controlling the charging time constant of said memory cell.

* * * * *

UNITED STATES PATENT AND TRADEMARK OFFICE
CERTIFICATE OF CORRECTION

PATENT NO. : 4,130,892
DATED : December 19, 1978
INVENTOR(S) : Thomas L. Gunckel, II,; Alex Rovell; Robert L. Nielsen It is certified that error appears in the above-identified patent and that said Letters Patent are hereby corrected as shown below:

Col. 6, line 55 after "FETs $Q_{13}$ and $Q_{14}$" insert --. FETs $Q_{13}$ and $Q_{14}$--.

Col. 7, line 20 after "FETs" delete [Qhd 17,] and insert --Q17,--.

Col. 8, line 5 after "is" delete [used] and insert --read--.

Signed and Sealed this

Seventeenth Day of April 1979

[SEAL]

Attest:

RUTH C. MASON
Attesting Officer

DONALD W. BANNER
Commissioner of Patents and Trademarks